(12) United States Patent
Park et al.

(10) Patent No.: US 12,249,844 B2
(45) Date of Patent: Mar. 11, 2025

(54) WIRELESS POWER TRANSMITTING APPARATUS AND METHOD FOR WIRELESSLY TRANSMITTING POWER BY WIRELESS POWER TRANSMITTING APPARATUS

(71) Applicant: Samsung Electronics Co., Ltd., Suwon-si (KR)

(72) Inventors: Jaeseok Park, Suwon-si (KR); Jaehyun Park, Suwon-si (KR); Beomwoo Gu, Suwon-si (KR); Kangho Byun, Suwon-si (KR); Sungku Yeo, Suwon-si (KR); Youngho Ryu, Suwon-si (KR); Chongmin Lee, Suwon-si (KR); Hyoseok Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 14 days.

(21) Appl. No.: 18/456,176

(22) Filed: Aug. 25, 2023

(65) Prior Publication Data
US 2023/0402879 A1 Dec. 14, 2023

Related U.S. Application Data

(63) Continuation of application No. PCT/KR2022/003119, filed on Mar. 4, 2022.

(30) Foreign Application Priority Data

Mar. 22, 2021 (KR) .................. 10-2021-0036795

(51) Int. Cl.
*H02J 50/12* (2016.01)
*G01R 25/00* (2006.01)
(Continued)

(52) U.S. Cl.
CPC .............. *H02J 50/12* (2016.02); *G01R 25/00* (2013.01); *G01R 27/02* (2013.01); *H02J 50/60* (2016.02)

(58) Field of Classification Search
CPC .. H02J 50/12; H02J 50/60; H02J 50/50; H02J 50/90; H04B 5/79; G01R 25/00;
(Continued)

(56) References Cited

U.S. PATENT DOCUMENTS

| 2010/0217553 | A1 | 8/2010 | Von et al. |
| 2012/0038220 | A1* | 2/2012 | Kim ..................... H02J 50/12 307/104 |

(Continued)

FOREIGN PATENT DOCUMENTS

| KR | 20110112435 A | 10/2011 |
| KR | 20130045215 A | 5/2013 |

(Continued)

OTHER PUBLICATIONS

International Search Report for PCT/KR2022/003119 mailed Jun. 16, 2022, 5 pages.

(Continued)

*Primary Examiner* — Ryan Johnson
(74) *Attorney, Agent, or Firm* — Nixon & Vanderhye, P.C.

(57) ABSTRACT

The disclosure provides a wireless power transmitting apparatus and a method for wirelessly transmitting power by the wireless power transmitting apparatus. The wireless power transmitting apparatus according to an example embodiment comprises: a power amplifier; a coil connected to the power amplifier and configured to generate an electromagnetic field based on power received from the power amplifier; an impedance sensing circuit connected between the power amplifier and the coil; at least one auxiliary coil electro- (Continued)

magnetically coupled to the coil; and a controller, wherein the controller may be configured to: identify a change in impedance, from a signal sensed through the impedance sensing circuit, and adjust an operation setting of the at least one auxiliary coil based on the identified change in impedance.

20 Claims, 16 Drawing Sheets

(51) Int. Cl.
*G01R 27/02* (2006.01)
*H02J 50/60* (2016.01)

(58) Field of Classification Search
CPC ........ G01R 27/02; G01R 27/08; G01R 27/16; G01R 27/26
See application file for complete search history.

(56) References Cited

U.S. PATENT DOCUMENTS

| | | | |
|---|---|---|---|
| 2012/0056485 A1* | 3/2012 | Haruyama | H02J 50/80 307/104 |
| 2013/0099734 A1 | 4/2013 | Lee et al. | |
| 2013/0313893 A1* | 11/2013 | Ichikawa | B60L 53/36 307/104 |
| 2014/0319923 A1 | 10/2014 | Lee et al. | |
| 2016/0285280 A1 | 9/2016 | Kallal et al. | |
| 2019/0348855 A1 | 11/2019 | Uchida | |
| 2020/0203998 A1 | 6/2020 | Almudallal et al. | |
| 2020/0271704 A1 | 8/2020 | Hwang et al. | |
| 2020/0274397 A1 | 8/2020 | Hwang et al. | |
| 2021/0210282 A1 | 7/2021 | Goodchild et al. | |

FOREIGN PATENT DOCUMENTS

| | | |
|---|---|---|
| KR | 20130087708 A | 8/2013 |
| KR | 20160092093 A | 8/2016 |
| KR | 20160126743 A | 11/2016 |
| KR | 20170118573 A | 10/2017 |
| KR | 20170141101 A | 12/2017 |
| KR | 20220154666 A | 11/2022 |

OTHER PUBLICATIONS

Written Opinion of the ISA for PCT/KR2022/003119 mailed Jun. 16, 2022, 5 pages.

* cited by examiner

ND METHOD FOR
WIRELESS POWER TRANSMITTING APPARATUS AND METHOD FOR WIRELESSLY TRANSMITTING POWER BY WIRELESS POWER TRANSMITTING APPARATUS

CROSS-REFERENCE TO RELATED APPLICATIONS

This application is a continuation of International Application No. PCT/KR2022/03119 designating the United States, filed on Mar. 4, 2022, in the Korean Intellectual Property Receiving Office and claiming priority to Korean Patent Application No. 10-2021-0036795, filed on Mar. 22, 2021, in the Korean Intellectual Property Office, the disclosures of each of which are incorporated by reference herein in their entireties.

BACKGROUND

Field

The disclosure relates to a wireless power transmitting apparatus and a method for wirelessly transmitting power by a wireless power transmitting apparatus.

Description of Related Art

Wireless charging technology uses wireless power transmission and reception and indicates a technology that allows a battery of a mobile phone to be automatically charged by simply placing the mobile phone on a wireless power transmitting apparatus (e.g., a charging pad) without connecting a separate charging connector. The wireless charging technology is advantageous in that the technology requires no connector for supplying power to an electronic product so as to improve a waterproofing function and requires no wired charger so as to increase portability of an electronic apparatus.

The recent development of the wireless charging technology has led to research into methods for charging by supplying power from one electronic apparatus (wireless power transmitting apparatus) to various other apparatuses (wireless power receiving apparatuses). The wireless charging technology includes an electromagnetic induction method using a coil, a resonance method using resonance, and a radio frequency radiation (RF, microwave radiation) method that converts electrical energy into microwaves and transmits the same.

Recently, wireless charging technologies using the electromagnetic induction method or the resonance method have been widely used, focusing on electronic apparatuses, such as a smartphone. In case that a wireless power transmitting unit (PTU) (e.g., a wireless power transmitting apparatus) and a wireless power receiving unit (PRU) (e.g., a smartphone or a wearable electronic apparatus) come in contact or approach within a certain distance, a battery of the wireless receiving unit may be charged by methods such as electromagnetic induction or electromagnetic resonance between a transmission coil or a resonator of the wireless power transmitting unit and a reception coil or a resonator of the wireless power receiving unit.

Presence of a metal material around a wireless power transmitting apparatus may affect performance of a transmission resonator of the wireless power transmitting apparatus. For example, as a resonance frequency is changed due to the metal material disposed around the wireless power transmitting apparatus, power may not be effectively transferred to the wireless power receiving apparatus.

SUMMARY

Embodiments of the disclosure may provide a wireless power transmitting method of a wireless power transmitting apparatus and a wireless power receiving apparatus, which may improve wireless power transmission efficiency of a resonator by detecting a change in impedance of the resonator (e.g., a coil) included in the wireless power transmitting apparatus and correcting a changed resonance frequency according to the impedance change through an auxiliary coil.

Embodiments of the disclosure may provide a wireless power transmitting method of a wireless power transmitting apparatus and a wireless power receiving apparatus, which may detect a change in impedance of a resonator (e.g., a coil) from a signal coupled by a coupler.

A wireless power transmitting apparatus according to an example embodiment of the disclosure may include: a power amplifier, a coil connected to the power amplifier and configured to generate an electromagnetic field based on power received from the power amplifier, an impedance sensing circuit connected between the power amplifier and the coil, at least one auxiliary coil electromagnetically coupled to the coil, and a controller, wherein the controller is configured to: identify an impedance change from a signal sensed through the impedance sensing circuit, and adjust an operation configuration of the at least one auxiliary coil based on the identified change in impedance.

A wireless power transmitting method of a wireless power transmitting apparatus according to an example embodiment may include: generating an electromagnetic field through a coil based on power received from a power amplifier, identifying an impedance change from a signal sensed through an impedance sensing circuit connected between the amplifier and the coil, and adjusting an operation configuration of at least one auxiliary coil electromagnetically coupled with the coil based on the identified change in impedance.

A wireless power transmitting apparatus and a wireless power transmitting method of the wireless power transmitting apparatus according to various example embodiments may detect a change in impedance of a resonator (e.g., a coil) included in the wireless power transmitting apparatus and correct a changed resonance frequency according to the impedance change through an auxiliary coil to improve wireless power transmission efficiency of the resonator.

The wireless power transmitting apparatus and the wireless power transmitting method of the wireless power transmitting apparatus according to various example embodiments may estimate a phase difference of a voltage and current from a signal coupled by a coupler without addition of a separate voltage and current detection circuit so as to detect a change in impedance of a resonator (e.g., a coil).

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1A:
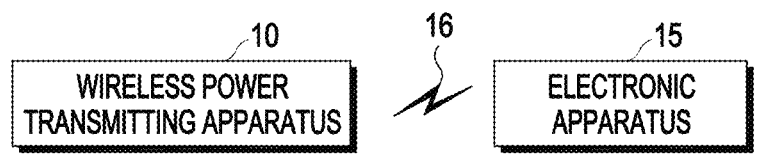
FIG. 1A is a block diagram illustrating an example wireless power transmitting apparatus and a wireless power receiving apparatus according to various embodiments.

Hereinafter, various example embodiments of the disclosure will be described in greater detail with reference to the accompanying drawings. It should be noted that like elements are indicated by like reference numerals throughout the drawings wherever possible. In the following description and drawings, a detailed description of known functions and configurations incorporated herein may be omitted when it may obscure the subject matter of the disclosure.

Referring to FIG. 1A, a wireless power transmitting apparatus 10 (e.g., an electronic apparatus) according to various embodiments may wirelessly transmit power 16 to a wireless power receiving apparatus 15 (hereinafter, referred to as an "electronic apparatus 15" or an "external electronic apparatus"). The wireless power transmitting apparatus 10 may transmit power 16 to the electronic apparatus 15 using various charging methods. For example, the wireless power transmitting apparatus 10 may transmit power 16 according to an induction method. In case that the wireless power transmitting apparatus 10 adopts the induction method, the wireless power transmitting apparatus 10 may include, for example, a power source, a DC-AC conversion circuit, an amplifier circuit, an impedance matching circuit, at least one capacitor, at least one coil, a communication modulation/demodulation circuit, and the like. The at least one capacitor may include a resonance circuit together with the at least one coil. The wireless power transmitting apparatus 10 may operate in a manner defined by the wireless power consortium standard (WPC) (or the Qi standard).

For example, the wireless power transmitting apparatus 10 may transmit power 16 according to a resonance method. In case of adopting the resonance method, the wireless power transmitting apparatus 10 may include, for example, a power source, a DC-AC conversion circuit, an amplifier circuit, an impedance matching circuit, at least one capacitor, at least one resonator or coil, an out-band communication modulation circuit (e.g., a Bluetooth low energy (BLE) communication circuit), and the like. The at least one capacitor and the at least one resonator or coil may include a resonance circuit. The wireless power transmitting apparatus 10 may operate in a manner defined by, for example, the alliance for wireless power standard (A4WP) (or air fuel alliance standard (AFA)). The wireless power transmitting apparatus 10 may include a resonator or coil capable of generating an induced magnetic field when a current flows according to a resonance method or an induction method. A procedure in which the wireless power transmitting apparatus 10 generates or forms an induced magnetic field may be expressed as the wireless power transmitting apparatus 10 wirelessly transmits power 16. The electronic apparatus 15 may include a coil on which induced electromotive force is generated by a magnetic field formed therearound and time-dependently changed in size. A process in which the electronic apparatus 15 generates an induced electromotive force through a resonator or a coil may be expressed as the electronic apparatus 15 wirelessly receives power 16.

The wireless power transmitting apparatus 10 according to various embodiments may perform communication with the electronic apparatus 15. For example, the wireless power transmitting apparatus 10 may perform communication with the electronic apparatus 15 according to an in-band method. The wireless power transmitting apparatus 10 or the electronic apparatus 15 may change a load (or impedance) in response to data to be transmitted according to, for example, an on-off keying modulation scheme. The wireless power transmitting apparatus 10 or the electronic apparatus 15 may measure a load change (or impedance change) based on a change in size of a current, voltage, or power of a resonator or a coil to identify data to be transmitted by a counterpart apparatus.

For example, the wireless power transmitting apparatus 10 may perform communication with the electronic apparatus 15 according to an out-band (or out-of-band) method. The wireless power transmitting apparatus 10 or the electronic apparatus 15 may transmit or receive data using a near field communication module (e.g., a BLE communication module) provided separately from a resonator, a coil, or a patch antenna.

Figure 1B:
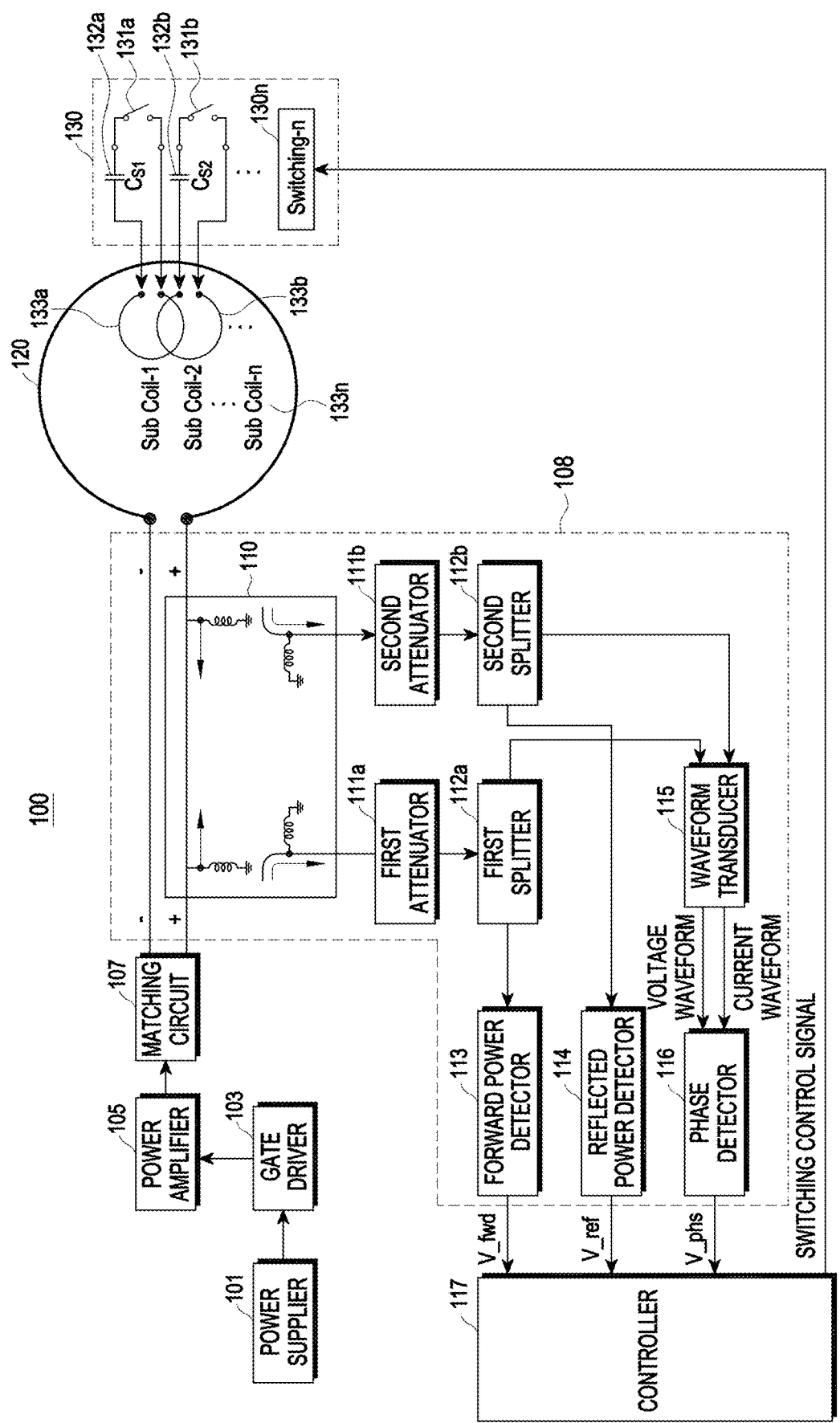
FIG. 1B is a circuit diagram illustrating an example wireless power transmitting apparatus according to various embodiments.

FIG. 1B is a circuit diagram illustrating an example wireless power transmitting apparatus according to various embodiments. Referring to FIG. 1B, the wireless power transmitting apparatus 10 may include a power supply (source) 101, a gate driver 103, a power amplifier 105, a matching circuit 107, an impedance sensing circuit 108, a controller (e.g., including processing circuitry) 117, a coil 120, an auxiliary coil circuit 130.

According to various embodiments, the power supplier 101 may supply power for the gate driver 103. For example, in case that the wireless power transmitting apparatus 10 transmits power in a resonance method, the power supplier 101 may supply a power source having a frequency of 6.78 MHz to the gate driver 103. The gate driver 103 may control a gate terminal of the power amplifier 105 based on a power source supplied from the power supplier 101. The power amplifier 105 may amplify power of a signal to be transmitted and output power as a signal at a desired frequency (e.g., 6.78 MHz) by control of the gate driver 103. The matching circuit 107 may perform impedance matching. The signal output through the matching circuit 107 may be supplied to the coil 120 via a coupler 110 (e.g., a directional coupler) of the sensing circuit 108. The coil 120 (e.g., a resonance coil) may transmit or radiate power output through the coupler 110 through a wireless space. The coil 120 may be referred to as a resonator and the resonator may further include at least one capacitor (not shown) connected to the coil 120.

According to various embodiments, the impedance sensing circuit 108 may include the coupler 110, a first attenuator 111a, a second attenuator 111b, a first splitter 112a, a second splitter 112b, a forward power detector 113, a reflection power detector (or backward power detector) 114, a waveform transducer 115, and a phase detector 116. According to various embodiments, as described below with reference to FIG. 9, at least one of the first attenuator 111a, the second attenuator 111b, the first splitter 112a, the second splitter 112b, the forward power detector 113, the reflection power detector 114 may be omitted from the impedance sensing circuit 108 and a signal coupled by the coupler 110 may be directly input to the waveform transducer 115.

According to various embodiments, an input port (hereinafter, referred to as a "first port" for convenience of description) of the coupler 110 may be connected to a plus (+) terminal of the matching circuit 107 and an output port (hereinafter, referred to as a "second port" for convenience of description) of the coupler 110 may be connected to one end of the coil 120. A minus (−) terminal of the matching circuit 107 may be connected to the other end of the coil 120. A signal (hereinafter, referred to as a "forward signal" for convenience of description) input to the input port (first port) of the coupler 110 may be coupled inside the coupler 110 to be input to the first attenuator 111a through a first coupling port (hereinafter, referred to as a "third port" for convenience of description). A reflected signal (hereinafter, referred to as a "backward signal" for convenience of description) input through the output port (second port) of the coupler 110 may be coupled inside the coupler 110 to be input to the second attenuator 111b through a second coupling port (hereinafter, referred to as a "fourth port" for convenience of description).

According to various embodiments, a signal output through the third port of the coupler 110 may be input to the first attenuator 111a and the first attenuator 111a may attenuate the input signal to be output to the first splitter 112a. A signal output through the fourth port of the coupler 110 may be input to the second attenuator 111a and the second attenuator 111b may attenuate the input signal to be output to the second splitter 112b. A signal input to the first splitter 112a may be output as a first forward signal and a second forward signal, the first forward signal may be input to the waveform transducer 115, and the second forward signal may be input to the forward power detector 113. A signal input to the second splitter 112b may be output as a first backward signal (first reflected signal) and a second backward signal (second reflected signal), the first backward signal may be input to the waveform transducer 115, and the second forward signal may be input to the reflection power detector (or backward power detector) 114.

According to various embodiments, the waveform transducer 115 may receive the first forward signal output from the first splitter 112a and the first backward signal output from the second splitter 112b and output a voltage waveform signal and a current waveform signal. The voltage waveform signal and the current waveform signal output from the waveform transducer 115 may be input to the phase detector 116. The phase detector 116 may receive the voltage waveform signal and the current waveform signal from the waveform transducer 115 and output a voltage V_phs corresponding to a phase difference between the voltage waveform signal and the current waveform signal. The voltage corresponding to a phase difference output from the phase detector 116 may be input to the controller 117.

According to various embodiments, the controller 117 may receive the voltage V_phs corresponding to a phase difference between the voltage waveform signal and the current waveform signal output from the phase detector 116 and identify an impedance change based on the input voltage V_phs corresponding to a phase difference. The controller 117 may adjust an operation configuration of each auxiliary coil 133 included in the auxiliary coil circuit 130 based on the identified impedance change. For example, the controller 117 may control turning on/off of a switch 131 connected to each auxiliary coil 113 based on the identified impedance change.

According to various embodiments, the auxiliary coil circuit 130 may include multiple switches 131a and 131b, multiple capacitors 132a and 132b, and multiple auxiliary coils 133a and 133b. For example, a first auxiliary coil 133a may be connected to a first capacitor 132a and a first switch 131a in series and a second auxiliary coil 133b may be connected to a second capacitor 132b and a second switch 131b in series. Although it is described that the auxiliary coil circuit 130 includes two auxiliary coils 133a and 133b in FIG. 1B, according to various embodiments, the auxiliary coil circuit 130 may include one auxiliary coil or three or more auxiliary coils. In case that the auxiliary coil circuit 130 includes multiple auxiliary coils, each auxiliary coil may be connected to at least one capacitor and switch in series.

According to various embodiments, the controller 117 may control the first switch 131a and/or the second switch 131b by a switching control signal to control the first auxiliary coil 133a and/or the second auxiliary coil 133b to be coupled or not to be coupled to the coil 120. The controller 117 may control a resonance frequency by controlling coupling of the first auxiliary coil 133a and/or the second auxiliary coil 133b to the coil 120. For example, the controller 117 may identify an impedance change based on a voltage V_phs corresponding to a phase difference output from the phase detector 116 and in case of determining that a resonance frequency is changed according to the impedance change, control turning on/off of the switch 131 connected to at least one auxiliary coil 133 so as to correct or calibrate the changed resonance frequency. A detailed description thereof will be given below with reference to FIG. 13 to FIG. 15.

According to various embodiments, the forward power detector 113 may receive a second forward signal output from the first splitter 112a and detect a size of forward power. For example, the forward power detector 113 may detect a size of power of the input second forward signal and output a voltage V_fwd of a forward signal. The voltage V_fwd of the forward signal output from the forward power detector 113 may be input to the controller 117. The reflection power detector 114 may receive the second backward signal (second reflected signal) output from the second splitter 112B and detect a size of backward power. For example, the backward power detector 114 may detect a size of power of the input second backward signal and output a voltage V_ref of a backward signal (reflected signal). The voltage V_fwd of the backward signal (reflected signal) output from the reflection power detector 114 may be input to the controller 117. According to various embodiments, the controller 117 may identify an impedance change based on the voltage V_fwd of the forward signal output from the forward power detector 113 and the voltage V_fwd of the backward signal (reflected signal) output from the reflection power detector 114. The controller 117 may adjust an operation configuration of each auxiliary coil 133 included in the auxiliary coil circuit 130 based on the identified impedance change. For example, the controller 117 may control turning on/off of a switch 131 connected to each auxiliary coil 113 by generating a switching control signal and transmitting the switching control signal to the auxiliary coil circuit 130 based on the identified impedance change.

According to various embodiments, the controller 117 may improve accuracy by generating a switching control signal considering all of the impedance change identified through the phase detector 116 and the impedance change identified through the forward power detector 113 and the reflection power detector 114.

Figure 2:
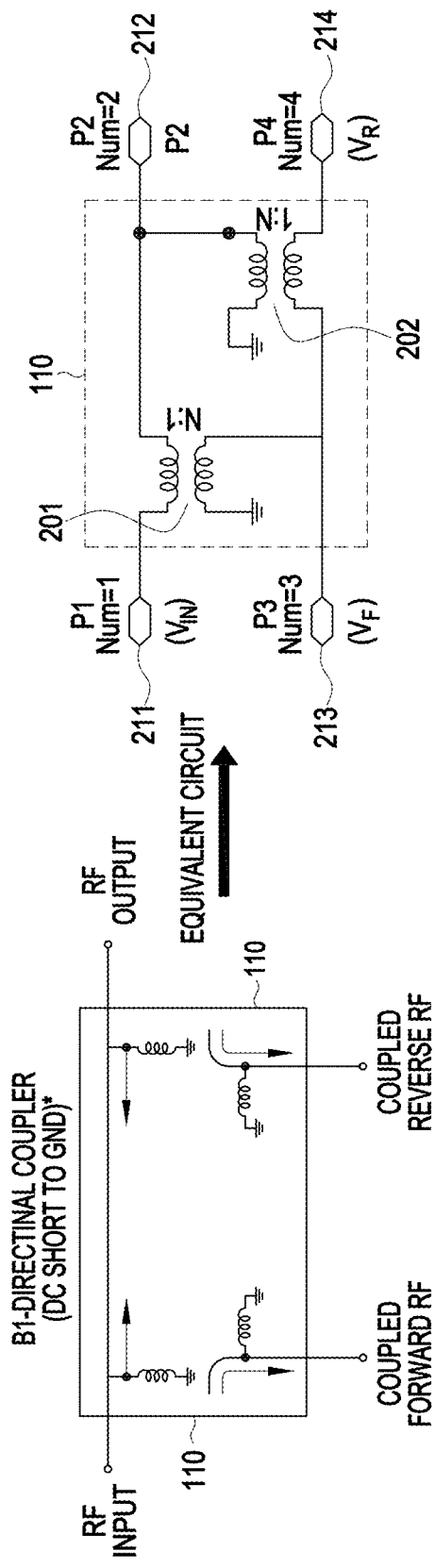
FIG. 2 is an equivalent circuit of a coupler according to various embodiments.

FIG. 2 is an equivalent circuit of a coupler according to various embodiments. Referring to FIG. 2, when a radio frequency (RF) signal is input to the input port (e.g., the first port P1) of the coupler 110 (e.g., a directional coupler), an RF signal may be output from the output port (e.g., the second port P2). The RF signal input to the input port may be referred to as a forward signal.

According to various embodiments, a forward signal input to the first port may be coupled to be output to the third port P3. A reflected signal (or backward signal or reverse signal) may be input to the second port. The reflected signal (or backward signal) input to the second port may be coupled to be output to the fourth port P4. For example, the third port P3 may be referred to as a coupling port of the first port P1 and the fourth port P4 may be referred to as a coupling port of the second port P2. According to various embodiments, if a circuit shown on the left side of FIG. 2 is represented as an equivalent circuit, it may be represented as a circuit shown on the right side. For example, it may be represented that the coupler 110 includes a first transformer (T₁) 201 between the first port P1 and the third port P3 and includes a second transformer (T₂) 202 between the second port P2 and the fourth port P4. The first transformer may correspond to a current transformer and the second transformer may correspond to a voltage transformer. The equivalent circuit in FIG. 2 may be analyzed as a simplified equivalent circuit as shown in FIG. 3 in terms of the first transformer and may be analyzed as a simplified equivalent circuit as shown in FIG. 4 in terms of the second transformer.

Figure 3:
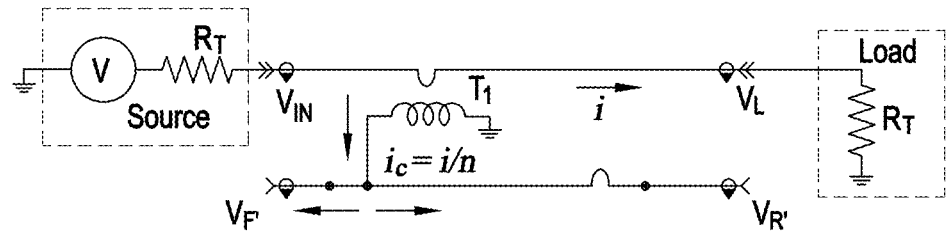
FIG. 3 is an equivalent circuit of a coupler according to various embodiments.
Figure 4:
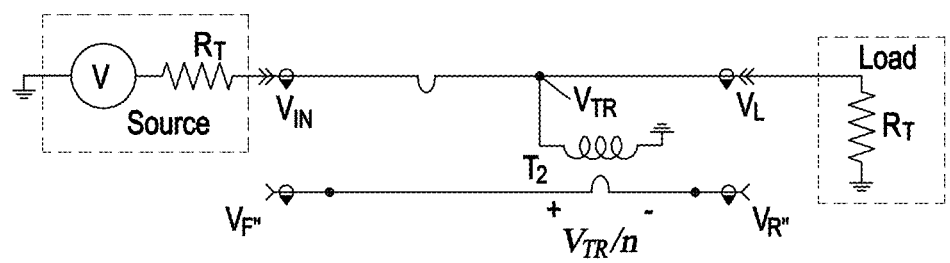
FIG. 4 is an equivalent circuit of a coupler according to various embodiments.

FIG. 3 is a an equivalent circuit of a coupler according to various embodiments and FIG. 4 is an equivalent circuit of a coupler according to various embodiments.

Referring to FIG. 3, a signal coupled in the first port P1 and output to the third port P3 may represent sensing of a current of an input signal. For example, a current i of a signal transmitted from the first port P1 to the second port P2 may be represented as <Equation 1> below.

$$i = \frac{V_{IN} - V_L}{R_T} \qquad \text{[Equation 1]}$$

In <Equation 1>, $V_{IN}$ may indicate a voltage of a signal input to the first port P1, and $V_L$ may indicate a voltage of a signal output to the second port P3. $R_T$ may indicate load resistance at an output terminal of the coupler 110. On the assumption that a turns ratio of the first transformer 201 is 1:N (1/n), a current $i_c$ coupled to the third port P3 may be represented as <Equation 2> below.

$$i_c = \frac{i}{n} = \frac{V_{IN} - V_L}{R_T} \times \frac{1}{n} \qquad \text{[Equation 2]}$$

Using <Equation 2> above, a voltage $V_F'$ at the third port P3 and a voltage $V_R'$ at the fourth port P4 may be represented as <Equation 4> below.

$$V_F' = V_R' = i_c \times \frac{R_T}{2} = \frac{V_{IN} - V_L}{2n} \qquad \text{[Equation 3]}$$

Referring to FIG. 4, a voltage may be sensed from the fourth port P4 coupled by the second transformer T2 at the second port P2. For example, a voltage $V_F''$ at the third port P3 and a voltage $V_R''$ at the fourth port P4 by the second transformer T2 may be represented as <Equation 4> and <Equation 5> below.

$$V_F'' = \frac{1}{2} \times \frac{V_{IN} + V_L}{n} \qquad \text{[Equation 4]}$$

$$V_R'' = -\frac{1}{2} \times \frac{V_{IN} + V_L}{n} \qquad \text{[Equation 5]}$$

When a superposition principle is applied in FIG. 3 and FIG. 4, a voltage $V_F$ of a forward signal and a voltage $V_R$ of a backward signal may be represented as <Equation 6> and <Equation 7> below, respectively.

$$V_F = V_F' + V_F'' = \frac{V_{IN} - V_L}{2n} + \frac{V_{IN} + V_L}{2n} = \frac{V_{IN}}{n} \qquad \text{[Equation 6]}$$

$$V_R = V_R' + V_R'' = \frac{V_{IN} - V_L}{2n} - \frac{V_{IN} + V_L}{2n} = 0 \qquad \text{[Equation 7]}$$

Referring to <Equation 6> and <Equation 7> above, the third port P3 may operate as a coupling port and the fourth port P4 may operate as an isolation port.

According to various embodiments, in case that a current $i_c$ at the third port P3 is expressed using $V_F$ and $V_R$, the current may be represented as <Equation 8> below.

$$i_c = \frac{V_F}{R_F} + \frac{V_R}{R_R} \qquad \text{[Equation 8]}$$

Assuming that $R_L$, $R_F$, and $R_R$ are identical in <Equation 8>, a current i of a forward signal may be represented as <Equation 9> below.

$$i = (V_F + V_R) \times \frac{n}{2R_L} \quad \text{[Equation 9]}$$

Referring to <Equation 9> above, it may be identified that a current i flowing from the first port P1 to the second port P2 of the coupler 110 is proportional to a sum of a coupled voltage $V_F$ of a forward signal and a coupled voltage $V_R$ of a backward signal. For example, a current waveform (current wave) of a signal output through a coupler may be identified based on the sum of the coupled voltage $V_F$ of a forward signal and the coupled voltage $V_R$ of a backward signal.

According to various embodiments, in case that a voltage $V_{TR}$ at the fourth port P4 of the coupler 110 is expressed using $V_F$ and $V_R$ using the above-described equations, the current may be represented as <Equation 10> and <Equation 11> below.

$$\frac{V_{TR}}{n} = V_F - V_R \quad \text{[Equation 10]}$$

$$V_{TR} = (V_F - V_R) \times n \quad \text{[Equation 11]}$$

Referring to <Equation 11> above, it may be identified that a voltage $V_{TR}$ at the fourth port P4 which corresponds to an output port of the coupler 110 is proportional to a difference between a coupled voltage $V_F$ of a forward signal and a coupled voltage $V_R$ of a backward signal. For example, a voltage waveform (voltage wave) of a signal output through a coupler may be identified based on the difference between a coupled voltage $V_F$ of a forward signal and a coupled voltage $V_R$ of a backward signal (e.g., by subtracting a coupled voltage of a forward signal and a coupled voltage of a reverse signal).

Figure 5:
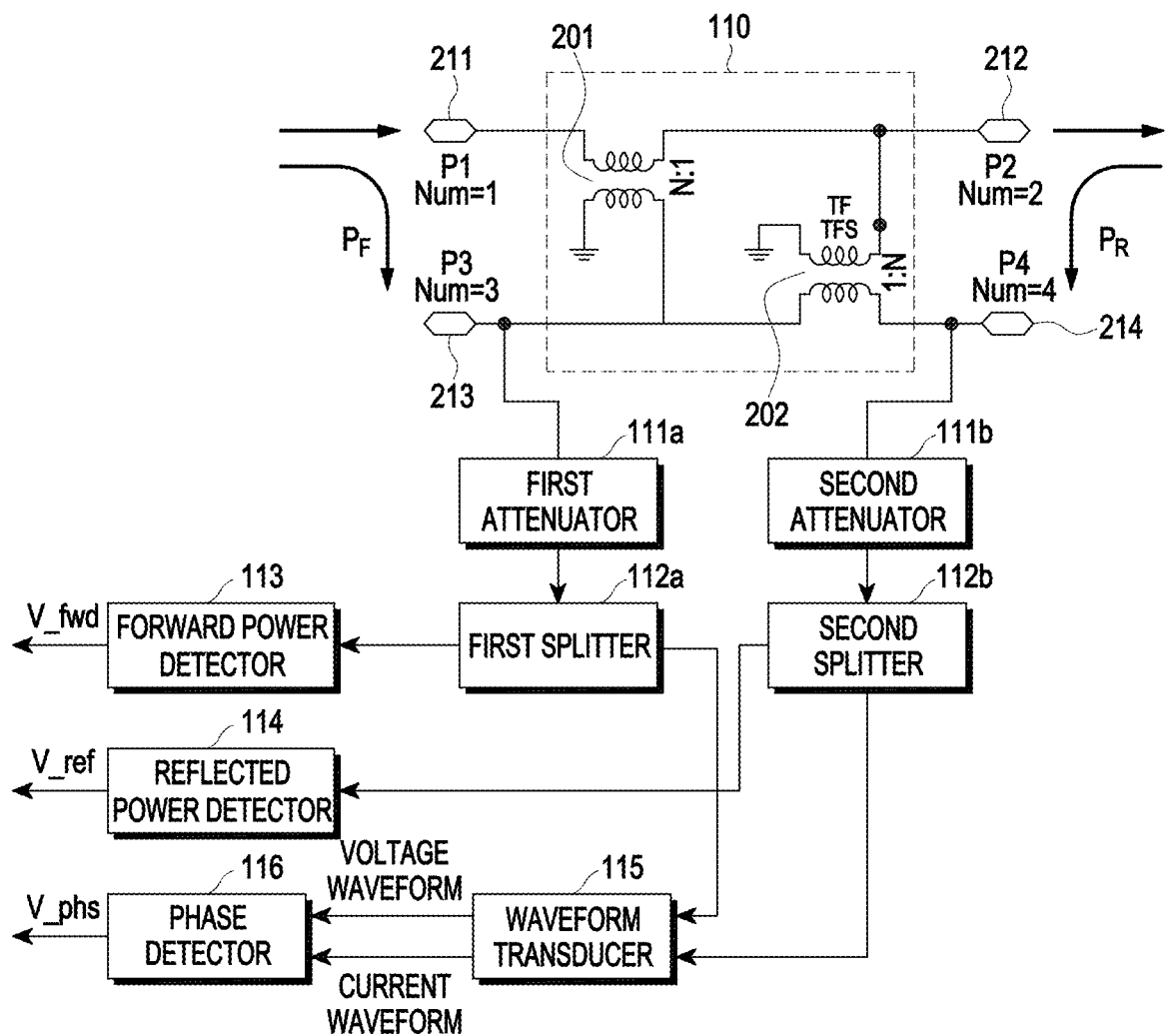
FIG. 5 is a diagram illustrating an impedance sensing circuit according to various embodiments.

FIG. 5 is a diagram illustrating an impedance sensing circuit according to various embodiments. Referring to FIG. 5, as described above, a signal (e.g., a forward signal) coupled at the first port 211 (P1) of the coupler 110 may be output through the third port 213 (P3). A signal output through the third port 213 may be input to the waveform transducer 115 through the first attenuator 111a and the first splitter 112a. According to various embodiments, the first attenuator 111a and/or the first splitter 112a may be omitted. A signal (e.g., a reflected signal or backward signal) coupled at the third port 213 (P3) of the coupler 110 may be output through the fourth port 213 (P3). A signal output through the fourth port 214 may be input to the waveform transducer 115 through the second attenuator 111b and the second splitter 112b. According to various embodiments, the second attenuator 111b and/or the second splitter 112b may be omitted.

According to various embodiments, an output signal of the first splitter 112a and an output signal of the second splitter 112b which are input to the waveform transducer 115 may output a voltage waveform signal and a current waveform signal based on above-described <Equation 9> and <Equation 11> based on a difference or a sum of the two signals (e.g., by summing or subtracting the two signals). The voltage waveform signal and the current waveform signal output from the waveform transducer 115 may be input to the phase detector 116. The phase detector 116 may receive the voltage waveform signal and the current waveform signal from the waveform transducer 115 and output a voltage V_phs corresponding to a phase difference between the voltage waveform signal and the current waveform signal. The voltage corresponding to a phase difference output from the phase detector 116 may be input to the controller 117.

Figure 6:
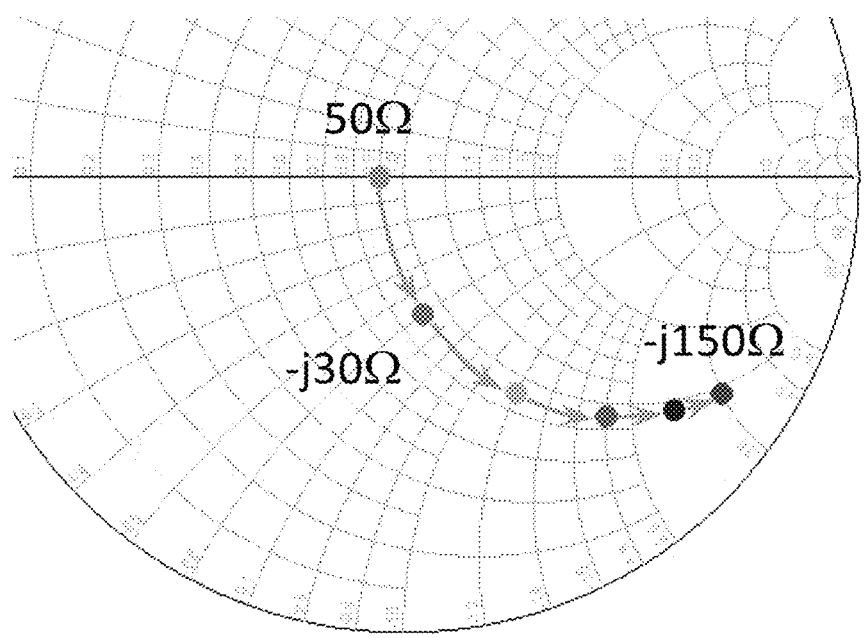
FIG. 6 is a graph illustrating a change in impedance of a resonator according to various embodiments.

FIG. 6 is a graph illustrating a change in impedance of a resonator according to various embodiments. Referring to FIG. 6, impedance measured at an output port of the coupler 110 may be variable by a metal object located around the wireless power transmitting apparatus 10. For example, a real component of impedance may be fixed to 50Ω, but an imaginary component thereof may be changed from 0Ω to 30Ω or from 30Ω to 150Ω as a metal object moves.

Figure 7:
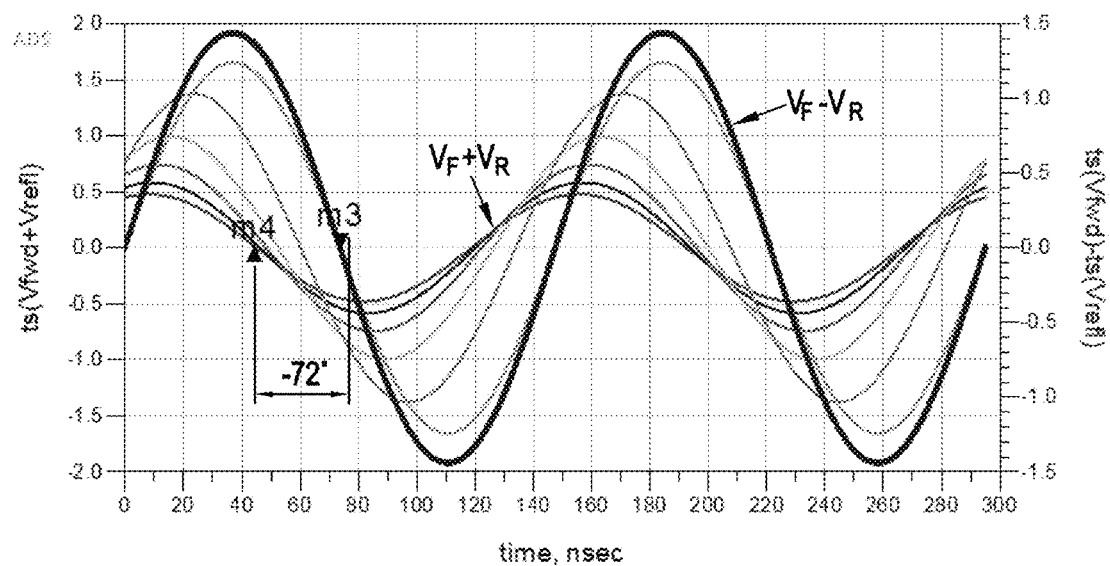
FIG. 7 is a graph illustrating a voltage coupled by a coupler according to various embodiments.
Figure 8:
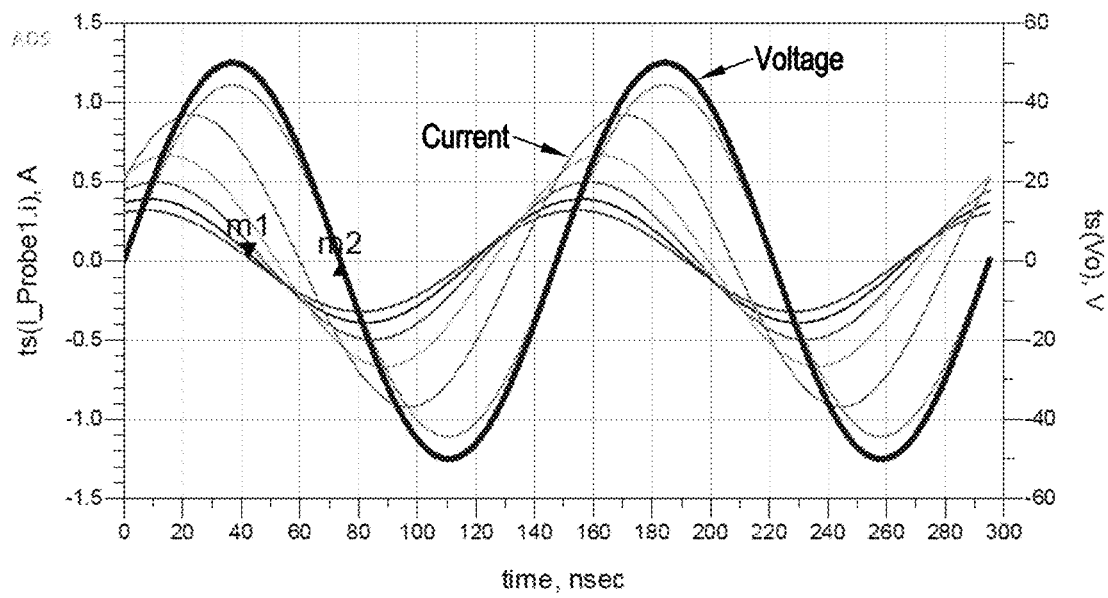
FIG. 8 is a graph illustrating a voltage measured at a rear end of a coupler according to various embodiments.

As described above with reference to FIG. 6, as impedance changes, a phase difference may occur between a voltage waveform and a current waveform of a signal output from the wireless power transmitting apparatus 10 as shown in FIG. 7. According to various embodiments, the voltage waveform signal and the current waveform signal shown in FIG. 7 may be estimated based on a sum or a difference of a coupled signal of a forward signal and a coupled signal of a backward signal as shown in FIG. 8 (e.g., by summing or subtracting a coupled signal of a forward signal and a coupled signal of a backward signal). For example, phases of a voltage waveform signal and a current waveform signal shown in FIG. 7 may be identical or similar to phases of signals shown in FIG. 8. According to various embodiments, a phase difference between a voltage waveform signal and a current waveform signal may be estimated through a phase difference of signals based on a sum or a difference of a coupled signal of a forward signal and a coupled signal of a backward signal.

Figure 9:
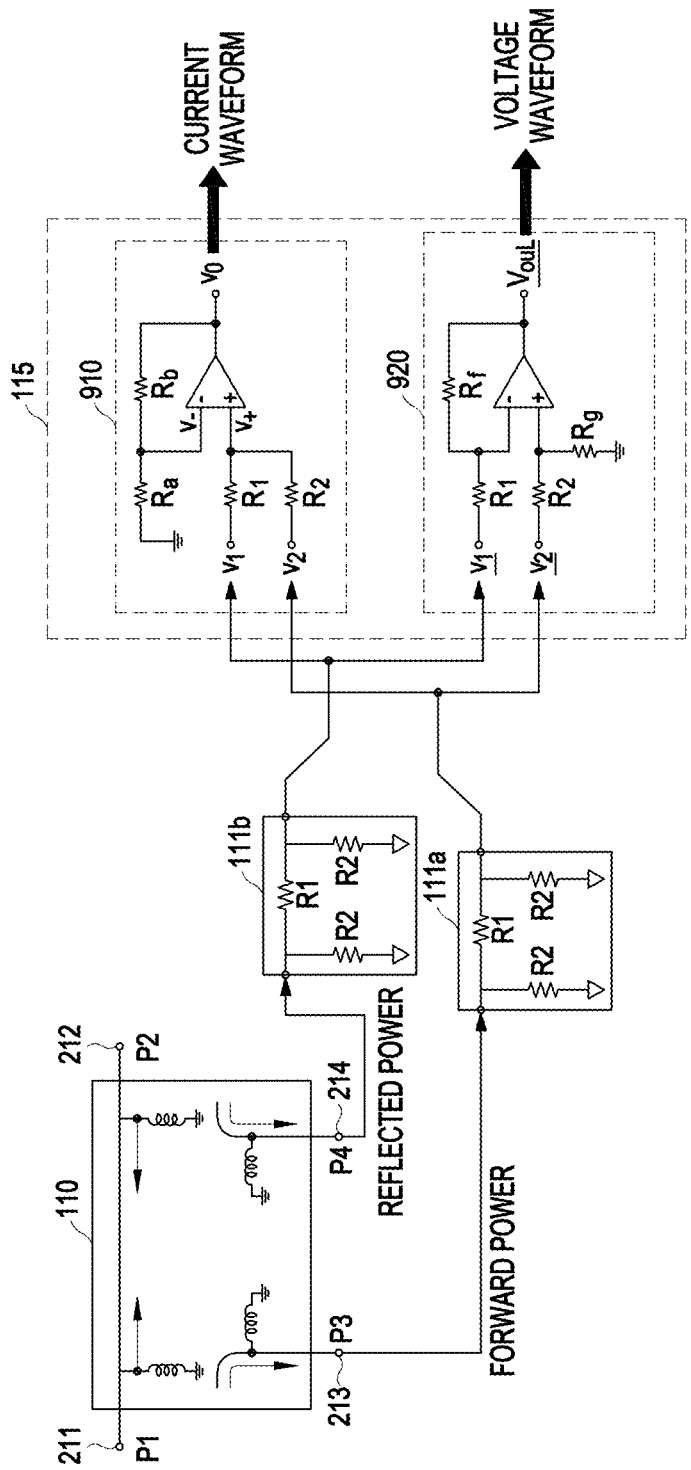
FIG. 9 is a diagram illustrating an impedance sensing circuit according to various embodiments.

FIG. 9 is a diagram illustrating an impedance sensing circuit according to various embodiments. Referring to FIG. 9, a signal (e.g., a forward signal) coupled at the first port (P1) 211 of the coupler 110 may be output through the third port (P3) 213 to be input to the first attenuator 111a. A signal attenuated at the first attenuator 111a may be input to an adder circuit 910 and a subtractor circuit 920 of the waveform transducer 115. A signal (e.g., a backward signal or reflected signal) coupled at the second port (P2) 212 of the coupler 110 may be output through the fourth port (P4) 214 to be input to the second attenuator 111b. A signal attenuated at the second attenuator 111b may be input to an adder circuit 910 and a subtractor circuit 920 of the waveform transducer 115.

According to various embodiments, the adder circuit 910 may output a current waveform signal based on a sum of signals output from the first attenuator 111a and the second attenuator 111b. The subtractor circuit 920 may output a voltage waveform signal based on a difference of signals output from the first attenuator 111a and the second attenuator 111b.

Figure 10:
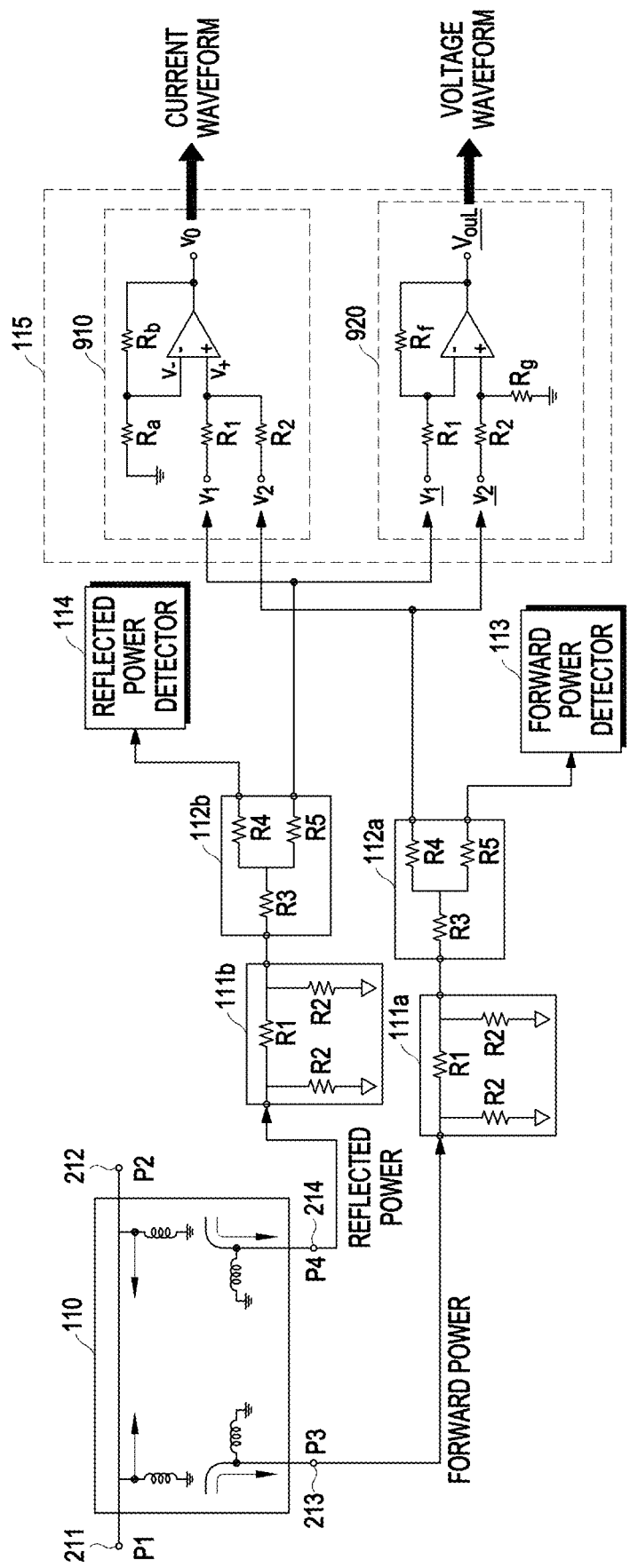
FIG. 10 is a diagram illustrating an impedance sensing circuit according to various embodiments.

FIG. 10 is a diagram illustrating an impedance sensing circuit according to various embodiments of. Referring to FIG. 10, a signal (e.g., a forward signal) coupled at the first port (P1) 211 of the coupler 110 may be output through the third port (P3) 213 to be input to the first attenuator 111a. A signal attenuated at the first attenuator 111a may be input to the first splitter 112a. The first splitter 112a may distributively output an input signal to the forward power detector 113 and the waveform transducer 115. For example, a signal output from the first splitter 112a may be input to the adder circuit 910 and the subtractor circuit 920 of the waveform transducer 115. A signal (e.g., a backward signal or reflected signal) coupled at the second port (P2) 212 of the coupler 110 may be output through the fourth port (P4) 214 to be input to the second attenuator 111b. A signal attenuated at the second attenuator 111b may be input to the second splitter 112b. The second splitter 112b may distributively output an input signal to the reflection power detector 114 and the waveform transducer 115. For example, a signal output from the second splitter 112b may be input to the adder circuit 910 and the subtractor circuit 920 of the waveform transducer 115.

According to various embodiments, the adder circuit 910 may output a current waveform signal based on a sum of signals output from the first splitter 112a and the second splitter 112b. The subtractor circuit 920 may output a voltage waveform signal by subtracting signals output from the first splitter 112a and the second splitter 112b.

Figure 11:
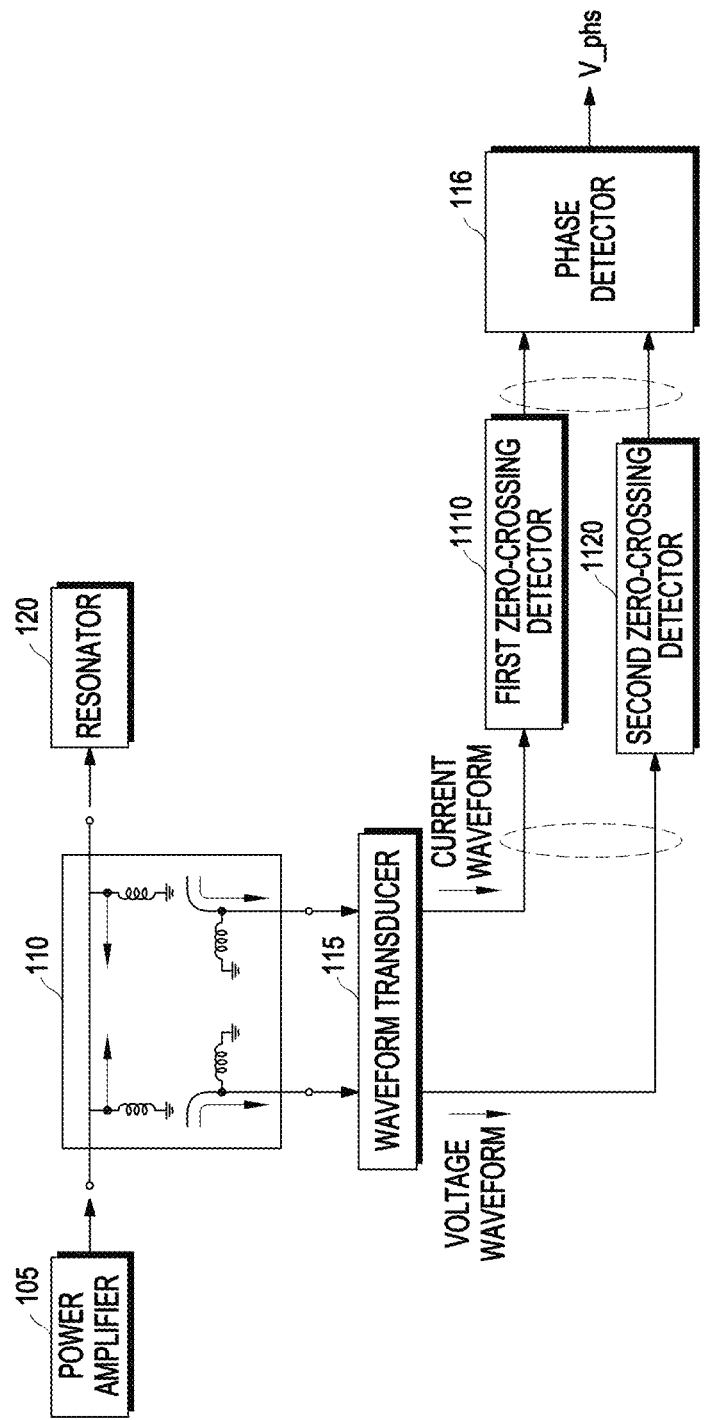
FIG. 11 is a diagram illustrating a wireless power transmitting apparatus according to various embodiments.

FIG. 11 is a diagram illustrating a wireless power transmitting apparatus according to various embodiments. Referring to FIG. 11, according to various embodiments, a current waveform signal output through the waveform transducer 115 may output a zero-crossed signal through a first zero-crossing detector 1110 and then may be input to the phase detector 116. A voltage waveform signal output through the waveform transducer 115 may output a zero-crossed signal through a second zero-crossing detector 1120 and then may be input to the phase detector 116.

Figure 12A:
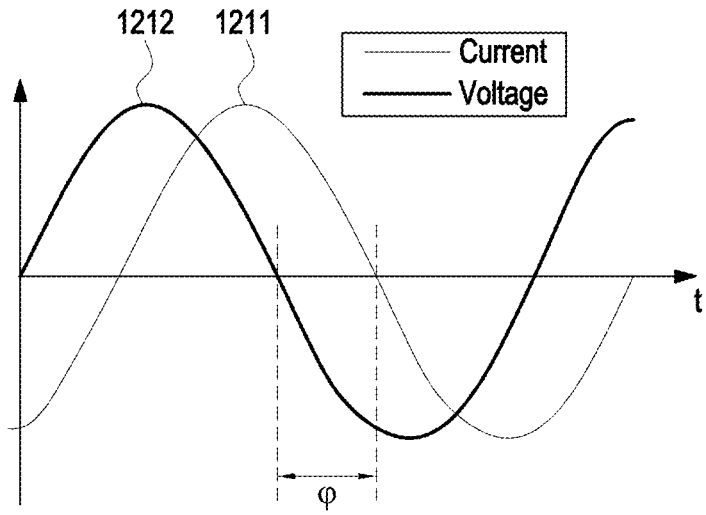
FIG. 12A is a graph illustrating an output waveform of a waveform transducer according to various embodiments.
Figure 12B:
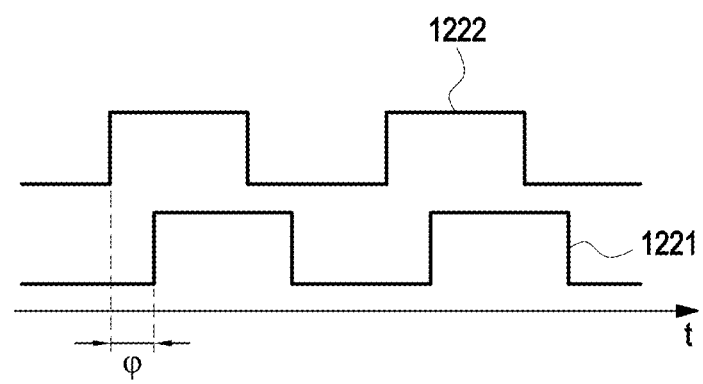
FIG. 12B is a graph illustrating an output waveform of a zero-crossing detector according to various embodiments.
Figure 12C:
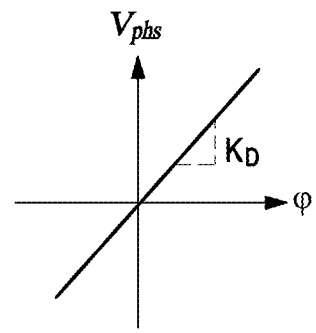
FIG. 12C is a graph illustrating an output value of a phase detector according to various embodiments.

FIG. 12A is a graph illustrating an output waveform of a waveform transducer according to various embodiments. Referring to FIG. 12A, a voltage waveform signal 1211 and a voltage waveform signal 1212 output from the waveform transducer 115 may be a phase difference φ therebetween. FIG. 12B is a graph illustrating an output waveform of a zero-crossing detector according to various embodiments. Referring to FIG. 12B, a current waveform signal 1221 output through the first zero-crossing detector 1110 and a voltage waveform signal 1222 output through the second zero-crossing detector 1120 may have a phase difference φ therebetween. FIG. 12C is a graph illustrating an output value of a phase detector according to various embodiments. Referring to FIG. 12C, the phase detector 116 may output a voltage V_phs proportional to a phase difference φ between an output signal of the first zero-crossing detector 1110 and an output signal of the second zero-crossing detector 1120.

Figure 12D:
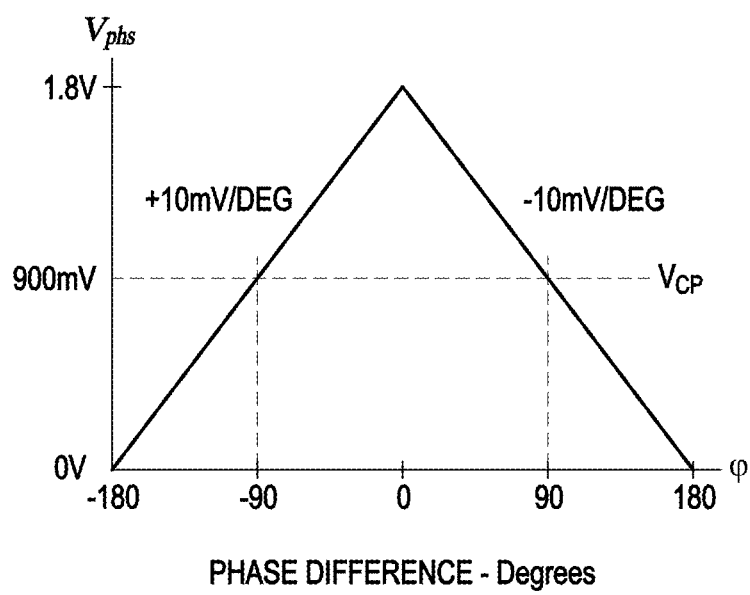
FIG. 12D is a graph illustrating a relationship between a phase difference and an output value of a phase detector according to various embodiments.

FIG. 12D is a graph illustrating a relationship between a phase difference and an output value of a phase detector according to various embodiments. Referring to FIG. 12D, a voltage V_phs proportional to a phase difference φ between an output signal of the first zero-crossing detector 1110 and an output signal of the second zero-crossing detector 1120 may be depicted as a graph. An increase in a phase difference according to an output value of the phase detector 116 to a positive value may indicate an increase in an inductive component, and an increase to a negative value may indicate an increase in a capacitive component.

Figure 13A:
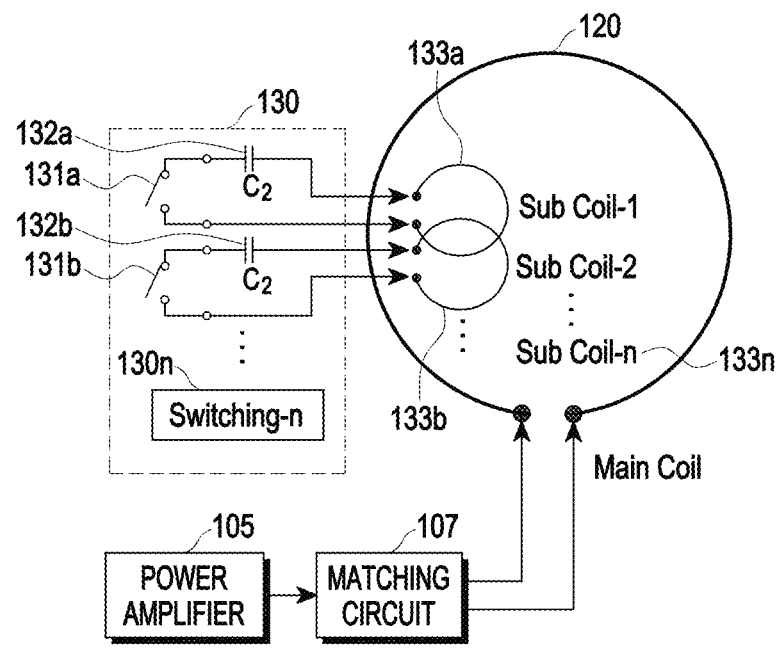
FIG. 13A is a diagram illustrating a resonator of a wireless power transmitting apparatus according to various embodiments.

FIG. 13A is a view illustrating a resonator of a wireless power transmitting apparatus according to various embodiments of the disclosure. According to various embodiments, referring to FIG. 13A, the controller 117 may determine an impedance change from a phase difference identified through the phase detector 116 and adjust an operation configuration of each auxiliary coil 133 included in the auxiliary coil circuit 130 based on the identified impedance change. For example, the controller 117 may control turning on/off of a switch 131 connected to each auxiliary coil 113 based on the identified impedance change.

According to various embodiments, the auxiliary coil circuit 130 may include multiple switches 131a and 131b, multiple capacitors 132a and 132b, and multiple auxiliary coils 133a and 133b. For example, a first auxiliary coil 133a may be connected to a first capacitor 132a and a first switch 131a in series and a second auxiliary coil 133b may be connected to a second capacitor 132b and a second switch 131b in series. Although it is described that the auxiliary coil circuit 130 includes two auxiliary coils 133a and 133b in FIG. 13, according to various embodiments, the auxiliary coil circuit 130 may include one auxiliary coil or three or more auxiliary coils. In case that the auxiliary coil circuit 130 includes multiple auxiliary coils, each auxiliary coil may be connected to at least one capacitor and switch in series.

According to various embodiments, the controller 117 may control the first switch 131a and/or the second switch 131b by a switching control signal to control the first auxiliary coil 133a and/or the second auxiliary coil 133b to be coupled or not to be coupled to the coil 120. The controller 117 may control a resonance frequency by controlling coupling of the first auxiliary coil 133a and/or the second auxiliary coil 133b to the coil 120. For example, the controller 117 may identify an impedance change based on a voltage V_phs corresponding to a phase difference output from the phase detector 116 and in case of determining that a resonance frequency is changed according to the impedance change, control turning on/off of the switch 131 connected to at least one auxiliary coil 133 so as to correct or calibrate the changed resonance frequency. For example, the controller 117 may transmit a switching control signal to the auxiliary coil circuit 130 to control each switch 131a or 131b included in the auxiliary coil circuit 130. In case that the first switch 131a and the second switch 131b are turned on by the switching control signal output from the controller 117, the first auxiliary coil 133a connected to the first switch 131a and the second auxiliary coil 133b connected to the second switch 131b may be coupled to the coil 120. In case that the first switch 131a is turned on and the second switch 131b is turned off by the switching control signal output from the controller 117, the first auxiliary coil 133a connected to the first switch 131a may be coupled to the coil 120 and the second auxiliary coil 133b connected to the second switch 131b may not be coupled to the coil 120. In case that the first switch 131a is turned off and the second switch 131b is turned on by the switching control signal output from the controller 117, the first auxiliary coil 133a connected to the first switch 131a may not be coupled to the coil 120 and the second auxiliary coil 133b connected to the second switch 131b may be coupled to the coil 120. In case that both the first switch 131a and the second switch 131b are turned off by the switching control signal output from the controller 117, the first auxiliary coil 133a connected to the first switch 131a and the second auxiliary coil 133b connected to the second switch 131b may not be coupled to the coil 120. According to whether the first auxiliary coil 133a connected to the first switch 131a and the second auxiliary coil 133b connected to the second switch 131b are coupled to the coil 120, a resonance frequency of the coil 120 may be adjusted. For example, in case that the auxiliary coil circuit 130 includes two auxiliary coils 133a and 133b, four resonance frequency matrices may be formed by switch control as shown in <Table 1> below.

TABLE 1

| First switch | Second switch | Resonance frequency |
|---|---|---|
| 0 | 0 | $f_0$ |
| 0 | 1 | $f_0 + f_1$ |
| 1 | 0 | $f_0 + f_2$ |
| 1 | 1 | $f_0 + f_3$ |

Figure 13B:
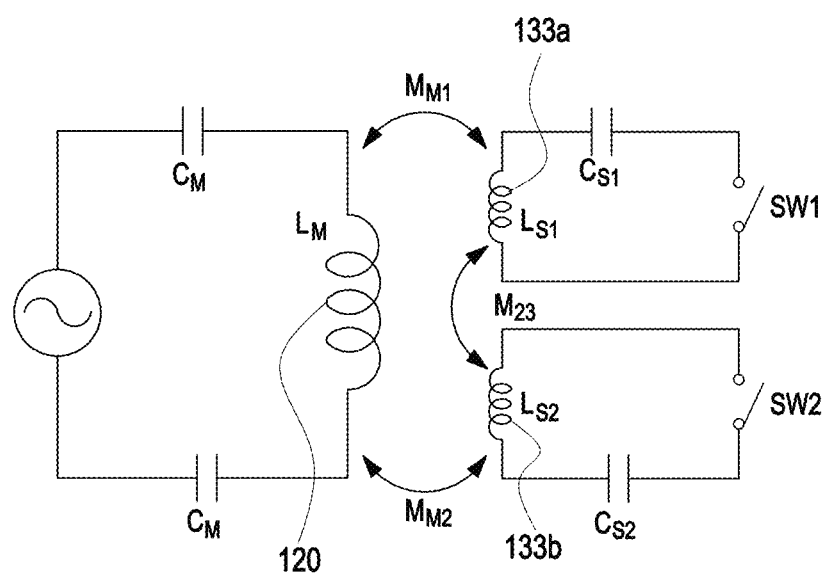
FIG. 13B is an equivalent circuit of a resonator of a wireless power transmitting apparatus according to various embodiments.

According to various embodiments, the controller 117 may adjust a resonance frequency by controlling turning on/off of the first switch and the second switch by a switching control signal. According to various embodiments, in case that the number of auxiliary coils is increased in the auxiliary coil circuit 130, resolution of a resonance frequency may be improved. FIG. 13B is a view illustrating an equivalent circuit of a resonator of a wireless power transmitting apparatus according to various embodiments of the disclosure. Referring to FIG. 13B, in case that the first switch (SW1) 131a is in a turned-on state, the first auxiliary coil ($L_{S1}$) 133a may be coupled to the coil ($L_M$) 120 to form a mutual inductance $M_{M1}$. In case that the second switch (SW2) 131b is in a turned-on state, the second auxiliary coil ($L_{S2}$) 133b may be coupled to the coil ($L_M$) 120 to form a mutual inductance $M_{M2}$. In case that the first switch (SW1) 131a and the second switch (SW2) 131b are simultaneously in a turned-on state, the first auxiliary coil ($L_{S1}$) 133a may be coupled to the second auxiliary coil ($L_{S1}$) 133b to form a mutual inductance $M_{12}$.

Figure 13C:
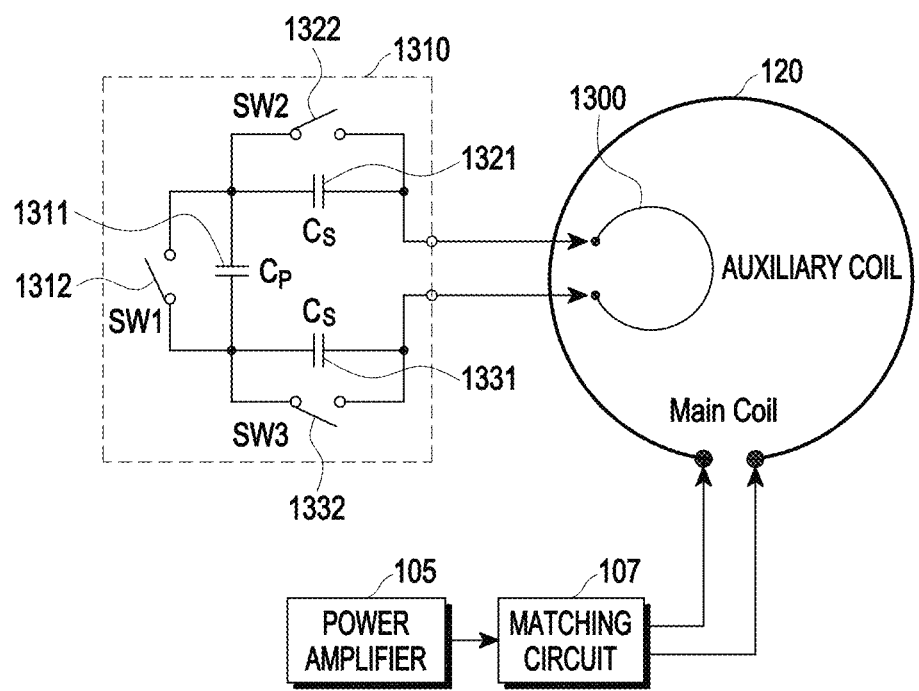
FIG. 13C is a diagram illustrating a resonator of a wireless power transmitting apparatus according to various embodiments.

FIG. 13C is a diagram illustrating a resonator of a wireless power transmitting apparatus according to various embodiments of the disclosure. Referring to FIG. 13C, according to various embodiments, one auxiliary coil 1300 of the auxiliary coil circuit 1300 may be connected in series with multiple capacitors 1311, 1321, and 1331. The multiple capacitors 1311, 1321, and 1331 may be connected in parallel with switches 1312, 1322, and 1332, respectively and controlled to be turned on/off. For example, a first capacitor 1311 may be connected in parallel with a first switch (SW1) 1312, a second capacitor 1321 may be connected in parallel with a second switch (SW2) 1322, and a third capacitor 1331 may be connected in parallel with a third switch (SW3) 1332. The controller 117 may control turning on/off of the first switch 1312, the second switch 1322, and the third switch 1332 by a switching control signal so as to adjust a resonance frequency. Although it is described that three capacitors are connected to the auxiliary coil 1300 in FIG. 13C, according to various embodiments, the auxiliary coil circuit 1310 may include one, two, or four or more capacitors connected to the auxiliary coil 1300.

Figure 14:
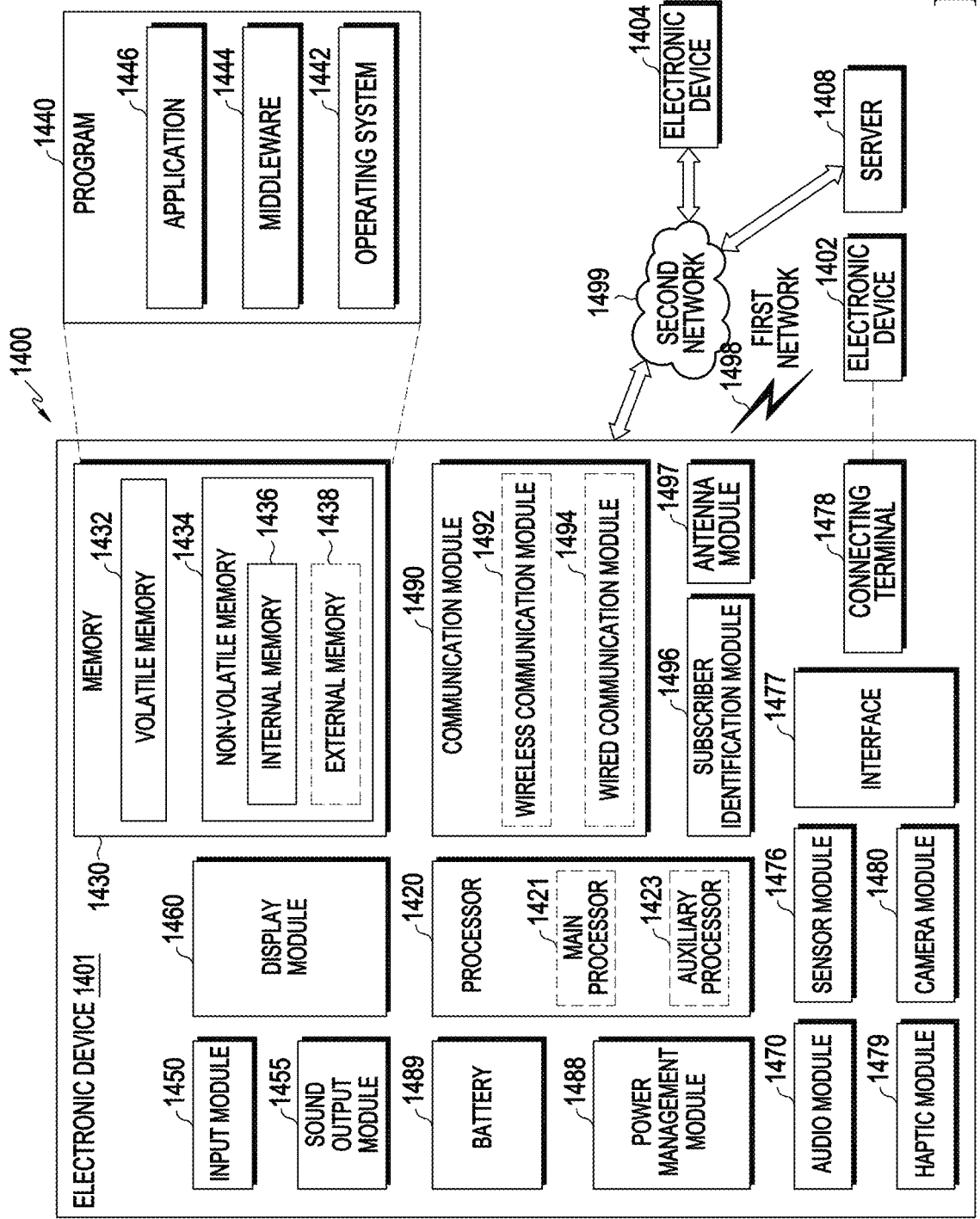
FIG. 14 is a block diagram illustrating an example electronic apparatus in a network environment according to various embodiments of the disclosure.

FIG. 14 is a block diagram illustrating an example electronic device 1401 in a network environment 1400 according to various embodiments. Referring to FIG. 14, the electronic device 1401 (e.g., wireless power transmission device 10 or electronic device 15) in the network environment 1400 may communicate with an electronic device 1402 via a first network 1498 (e.g., a short-range wireless communication network), or at least one of an electronic device 1404 or a server 1408 via a second network 1499 (e.g., a long-range wireless communication network). According to an embodiment, the electronic device 1401 may communicate with the electronic device 1404 via the server 1408. According to an embodiment, the electronic device 1401 may include a processor 1420, memory 1430, an input module 1450, a sound output module 1455, a display module 1460, an audio module 1470, a sensor module 1476, an interface 1477, a connecting terminal 1478, a haptic module 1479, a camera module 1480, a power management module 1488, a battery 1489, a communication module 1490, a subscriber identification module (SIM) 1496, or an antenna module 1497. In various embodiments, at least one of the components (e.g., the connecting terminal 1478) may be omitted from the electronic device 1401, or one or more other components may be added in the electronic device 1401. In various embodiments, some of the components (e.g., the sensor module 1476, the camera module 1480, or the antenna module 1497) may be implemented as a single component (e.g., the display module 1460).

The processor 1420 may execute, for example, software (e.g., a program 1440) to control at least one other component (e.g., a hardware or software component) of the electronic device 1401 coupled with the processor 1420, and may perform various data processing or computation. According to an embodiment, as at least part of the data processing or computation, the processor 1420 may store a command or data received from another component (e.g., the sensor module 1476 or the communication module 1490) in volatile memory 1432, process the command or the data stored in the volatile memory 1432, and store resulting data in non-volatile memory 1434. According to an embodiment, the processor 1420 may include a main processor 1421 (e.g., a central processing unit (CPU) or an application processor (AP)), or an auxiliary processor 1423 (e.g., a graphics processing unit (GPU), a neural processing unit (NPU), an image signal processor (ISP), a sensor hub processor, or a communication processor (CP)) that is operable independently from, or in conjunction with, the main processor 1421. For example, when the electronic device 1401 includes the main processor 1421 and the auxiliary processor 1423, the auxiliary processor 1423 may be adapted to consume less power than the main processor 1421, or to be specific to a specified function. The auxiliary processor 1423 may be implemented as separate from, or as part of the main processor 1421.

The auxiliary processor 1423 may control at least some of functions or states related to at least one component (e.g., the display module 1460, the sensor module 1476, or the communication module 1490) among the components of the electronic device 1401, instead of the main processor 1421 while the main processor 1421 is in an inactive (e.g., sleep) state, or together with the main processor 1421 while the main processor 1421 is in an active state (e.g., executing an application). According to an embodiment, the auxiliary processor 1423 (e.g., an image signal processor or a communication processor) may be implemented as part of another component (e.g., the camera module 1480 or the communication module 1490) functionally related to the auxiliary processor 1423. According to an embodiment, the auxiliary processor 1423 (e.g., the neural processing unit) may include a hardware structure specified for artificial intelligence model processing. An artificial intelligence model may be generated by machine learning. Such learning may be performed, e.g., by the electronic device 1401 where the artificial intelligence is performed or via a separate server (e.g., the server 1408). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1430 may store various data used by at least one component (e.g., the processor 1420 or the sensor module 1476) of the electronic device 1401. The various data may include, for example, software (e.g., the program 1440) and input data or output data for a command related thereto. The memory 1430 may include the volatile memory 1432 or the non-volatile memory 1434.

The program 1440 may be stored in the memory 1430 as software, and may include, for example, an operating system (OS) 1442, middleware 1444, or an application 1446.

The input module 1450 may receive a command or data to be used by another component (e.g., the processor 1420) of the electronic device 1401, from the outside (e.g., a user) of the electronic device 1401. The input module 1450 may include, for example, a microphone, a mouse, a keyboard, a key (e.g., a button), or a digital pen (e.g., a stylus pen).

The sound output module 1455 may output sound signals to the outside of the electronic device 1401. The sound output module 1455 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1460 may visually provide information to the outside (e.g., a user) of the electronic device 1401. The display module 1460 may include, for example, a display, a hologram device, or a projector and control circuitry to control a corresponding one of the display, hologram device, and projector. According to an embodiment, the display module 1460 may include a touch sensor adapted to detect a touch, or a pressure sensor adapted to measure the intensity of force incurred by the touch.

The audio module 1470 may convert a sound into an electrical signal and vice versa. According to an embodiment, the audio module 1470 may obtain the sound via the input module 1450, or output the sound via the sound output module 1455 or a headphone of an external electronic device (e.g., an electronic device 1402) directly (e.g., wiredly) or wirelessly coupled with the electronic device 1401.

The sensor module 1476 may detect an operational state (e.g., power or temperature) of the electronic device 1401 or an environmental state (e.g., a state of a user) external to the electronic device 1401, and then generate an electrical signal or data value corresponding to the detected state. According to an embodiment, the sensor module 1476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1477 may support one or more specified protocols to be used for the electronic device 1401 to be coupled with the external electronic device (e.g., the electronic device 1402) directly (e.g., wiredly) or wirelessly. According to an embodiment, the interface 1477 may include, for example, a high definition multimedia interface (HDMI), a universal serial bus (USB) interface, a secure digital (SD) card interface, or an audio interface.

A connecting terminal 1478 may include a connector via which the electronic device 1401 may be physically connected with the external electronic device (e.g., the electronic device 1402). According to an embodiment, the connecting terminal 1478 may include, for example, a HDMI connector, a USB connector, a SD card connector, or an audio connector (e.g., a headphone connector).

The haptic module 1479 may convert an electrical signal into a mechanical stimulus (e.g., a vibration or a movement) or electrical stimulus which may be recognized by a user via his tactile sensation or kinesthetic sensation. According to an embodiment, the haptic module 1479 may include, for example, a motor, a piezoelectric element, or an electric stimulator.

The camera module 1480 may capture a still image or moving images. According to an embodiment, the camera module 1480 may include one or more lenses, image sensors, image signal processors, or flashes.

The power management module 1488 may manage power supplied to the electronic device 1401. According to an embodiment, the power management module 1488 may be implemented as at least part of, for example, a power management integrated circuit (PMIC).

The battery 1489 may supply power to at least one component of the electronic device 1401. According to an embodiment, the battery 1489 may include, for example, a primary cell which is not rechargeable, a secondary cell which is rechargeable, or a fuel cell.

The communication module 1490 may support establishing a direct (e.g., wired) communication channel or a wireless communication channel between the electronic device 1401 and the external electronic device (e.g., the electronic device 1402, the electronic device 1404, or the server 1408) and performing communication via the established communication channel The communication module 1490 may include one or more communication processors that are operable independently from the processor 1420 (e.g., the application processor (AP)) and supports a direct (e.g., wired) communication or a wireless communication. According to an embodiment, the communication module 1490 may include a wireless communication module 1492 (e.g., a cellular communication module, a short-range wireless communication module, or a global navigation satellite system (GNSS) communication module) or a wired communication module 1494 (e.g., a local area network (LAN) communication module or a power line communication (PLC) module). A corresponding one of these communication modules may communicate with the external electronic device via the first network 1498 (e.g., a short-range communication network, such as Bluetooth™ wireless-fidelity (Wi-Fi) direct, or infrared data association (IrDA)) or the second network 1499 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1492 may identify and authenticate the electronic device 1401 in a communication network, such as the first network 1498 or the second network 1499, using subscriber information (e.g., international mobile subscriber identity (IMSI)) stored in the subscriber identification module 1496.

The wireless communication module 1492 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1492 may support a high-frequency band (e.g., the mmWave band) to achieve, e.g., a high data transmission rate. The wireless communication module 1492 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1492 may support various requirements specified in the electronic device 1401, an external electronic device (e.g., the electronic device 1404), or a network system (e.g., the second network 1499). According to an embodiment, the wireless communication module 1492 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1497 may transmit or receive a signal or power to or from the outside (e.g., the external electronic device) of the electronic device. According to an embodiment, the antenna module 1497 may include an antenna including a radiating element including a conductive material or a conductive pattern formed in or on a substrate (e.g., a printed circuit board (PCB)). According to an embodiment, the antenna module 1497 may include a plurality of antennas (e.g., array antennas). In such a case, at least one antenna appropriate for a communication scheme used in the communication network, such as the first network 1498 or the second network 1499, may be selected, for example, by the communication module 1490 (e.g., the wireless communication module) from the plurality of antennas. The signal or the power may then be transmitted or received between the communication module 1490 and the external electronic device via the selected at least one antenna. According to an embodiment, another component (e.g., a radio frequency integrated circuit (RFIC)) other than the radiating element may be additionally formed as part of the antenna module 1497.

According to various embodiments, the antenna module 1497 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1401 and the external electronic device 1404 via the server 1408 coupled with the second network 1499. Each of the electronic devices 1402 or 1404 may be a device of a same type as, or a different type, from the electronic device 1401. According to an embodiment, all or some of operations to be executed at the electronic device 1401 may be executed at one or more of the external electronic devices 1402, 1404, or 1408. For example, if the electronic device 1401 should perform a function or a service automatically, or in response to a request from a user or another device, the electronic device 1401, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1401. The electronic device 1401 may provide the outcome, with or without further processing of the outcome, as at least part of a reply to the request. To that end, a cloud computing, distributed computing, mobile edge computing (MEC), or client-server computing technology may be used, for example. The electronic device 1401 may provide ultra low-latency services using, e.g., distributed computing or mobile edge computing. In an embodiment, the external electronic device 1404 may include an internet-of-things (IoT) device. The server 1408 may be an intelligent server using machine learning and/or a neural network. According to an embodiment, the external electronic device 1404 or the server 1408 may be included in the second network 1499. The electronic device 1401 may be applied to intelligent services (e.g., smart home, smart city, smart car, or healthcare) based on 5G communication technology or IoT-related technology.

Figure 15:
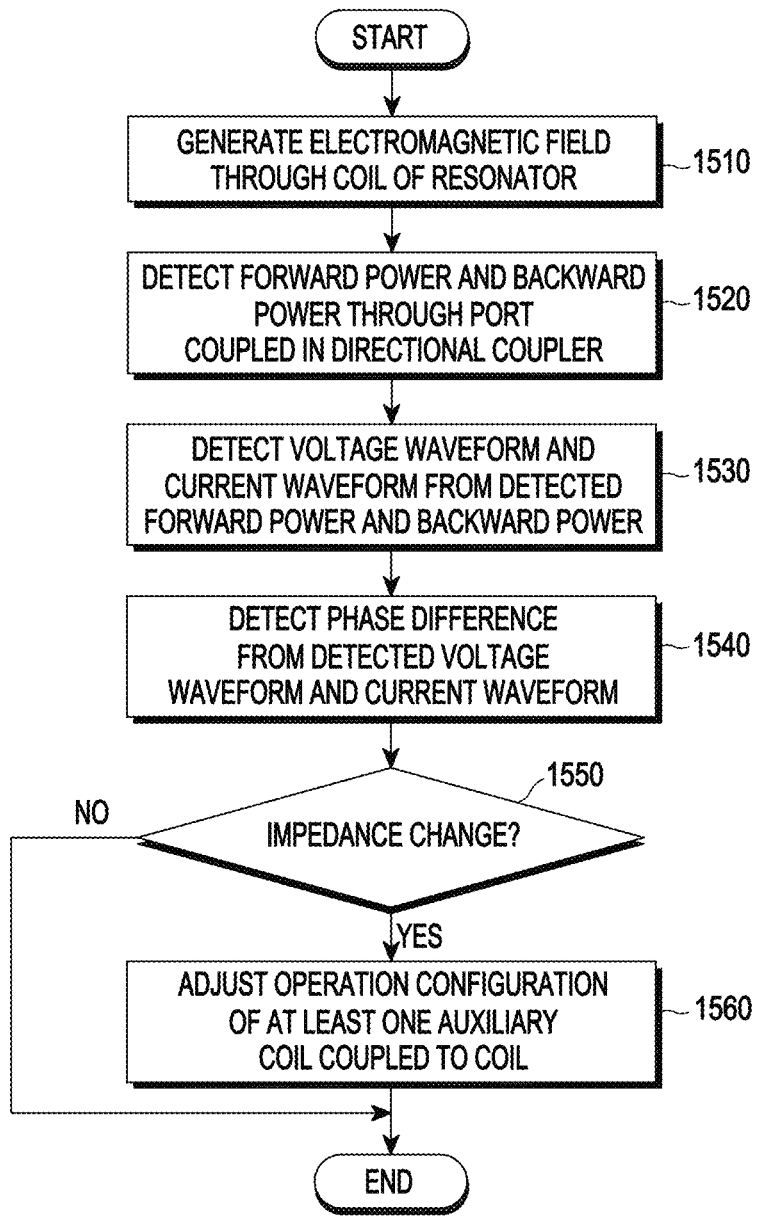
FIG. 15 is a flowchart illustrating an example wireless power transmitting operation of a wireless power transmitting apparatus according to various embodiments.

FIG. 15 is a flowchart illustrating an example wireless power transmitting operation of a wireless power transmitting apparatus according to various embodiments. Referring to FIG. 15, according to various embodiments, the wireless power transmitting apparatus 10 may generate or form an electromagnetic field based on power received from a power amplifier in operation 1510.

In operation 1520, the wireless power transmitting apparatus 10 may detect forward power and backward power through a port coupled in the coupler 110 (e.g., a directional coupler).

In operation 1530, the wireless power transmitting apparatus 10 may detect a voltage waveform and a current waveform from the detected forward power and backward power through the waveform transducer 115.

In operation 1540, the wireless power transmitting apparatus 10 may detect a phase difference from the detected voltage waveform and current waveform through the phase detector 116.

In operation 1550, the controller 117 of the wireless power transmitting apparatus 10 may determine an impedance change based on the phase difference.

In case of determining that impedance is changed (e.g., an impedance change amount exceeds a preconfigured value) according to a result of the determination (Yes in operation 1550), in operation 1560, a changed resonance frequency may be adjusted to be a desired resonance frequency by adjusting an operation configuration of at least one auxiliary coil 133 to be coupled to the coil 120.

A wireless power transmitting apparatus according an example embodiment of the disclosure may include: a power amplifier, a coil connected to the power amplifier and configured to generate an electromagnetic field based on power received from the power amplifier, an impedance sensing circuit connected between the power amplifier and the coil, at least one auxiliary coil electromagnetically coupled to the coil, and a controller, wherein the controller is configured to: identify an impedance change from a signal sensed through the impedance sensing circuit, and adjust an operation configuration of the at least one auxiliary coil based on the identified change in impedance.

According to various example embodiments, the impedance sensing circuit may include a directional coupler.

According to various example embodiments, the impedance sensing circuit may include a waveform transducer configured to receive a forward signal detected through a first coupling port of the directional coupler and a backward signal detected through a second coupling port of the directional coupler to output a voltage waveform signal and a current waveform signal; and a phase detector configured to receive the voltage waveform signal and the current waveform signal output from the waveform transducer to detect a phase difference between a voltage signal and a current signal.

According to various example embodiments, the waveform transducer may be configured to output the voltage waveform signal based on a difference of the forward signal and the backward signal and output the current waveform signal based on a sum of the forward signal and the backward signal.

According to various example embodiments, the controller may be configured to identify the impedance change based on the phase difference detected by the phase detector.

According to various example embodiments, the wireless power transmitting apparatus may further include a capacitor connected to the at least one auxiliary coil and a switch connected to the capacitor, and the controller may be configured to control turning on or off of the switch to control an operation of the at least one auxiliary coil.

According to various example embodiments, the controller may be configured to control an operation configuration of the at least one auxiliary coil to adjust a resonance frequency of an electromagnetic field generated through the coil.

According to various example embodiments, the wireless power transmitting apparatus may include multiple auxiliary coils and the controller may be configured to control turning on/off of multiple switches connected to each of the multiple auxiliary coils to adjust a resonance frequency of an electromagnetic field generated through the coil.

According to various example embodiments, the wireless power transmitting apparatus may further include: a first splitter configured to receive a forward signal detected through a first coupling port of the directional coupler and output a first forward signal and a second forward signal; and a second splitter configured to receive a backward signal detected through a second coupling port of the directional coupler and output a first backward signal and a second backward signal, wherein the waveform transducer may be configured to receive the first forward signal output from the first splitter and the first backward signal output from the second splitter and output the voltage waveform signal and the current waveform signal.

According to various example embodiments, the wireless power transmitting apparatus may further include: a forward power detector configured to detect forward power from a second forward signal output from the first splitter and a backward power detector configured to detect backward power from a second backward signal output from the second splitter, wherein the controller may be configured to identify an impedance change based on the forward power and the backward power.

According to various example embodiments, the wireless power transmitting apparatus may further include: a first attenuator configured to receive a forward signal detected through the first coupling port of the directional coupler to be attenuated and a second attenuator configured to receive a backward signal detected through the second coupling port of the directional coupler to be attenuated.

According to various example embodiments, the wireless power transmitting apparatus may include at least one capacitor connected to the coil, and the coil and the at least one capacitor may form a resonator.

According to various example embodiments, the wireless power transmitting apparatus may further include: a first zero-crossing detector configured to output a result of detecting a zero-crossing from the voltage waveform signal output from the waveform transducer and a second zero-crossing detector configured to output a result of detecting a zero crossing from the current waveform signal output from the waveform transducer.

A wireless power transmitting method of a wireless power transmitting apparatus according to various example embodiments may include: generating an electromagnetic field through a coil based on power received from a power amplifier, identifying an impedance change from a signal sensed through an impedance sensing circuit connected between the amplifier and the coil, and adjusting an operation configuration of at least one auxiliary coil electromagnetically coupled with the coil based on the identified change in impedance.

According to various example embodiments, the impedance sensing circuit may include a directional coupler.

According to various example embodiments, the method may include: receiving a forward signal detected through a first coupling port of the directional coupler and a backward signal detected through a second coupling port of the directional coupler to output a voltage waveform signal and a current waveform signal through a waveform transducer and receiving the voltage waveform signal and the current waveform signal output from the waveform transducer to detect a phase difference between a voltage signal and a current signal through a phase detector.

According to various example embodiments, the method may include outputting the voltage waveform signal based on a difference of the forward signal and the backward signal and outputting the current waveform signal based on a sum of the forward signal and the backward signal.

According to various example embodiments, the method may include identifying the impedance change based on the phase difference detected by the phase detector.

According to various example embodiments, the method may include controlling an operation configuration of the at least one auxiliary coil to adjust a resonance frequency of an electromagnetic field generated through the coil.

According to various example embodiments, the method may include controlling turning on/off of multiple switches connected to each of multiple auxiliary coils to adjust a resonance frequency of an electromagnetic field generated through the coil.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A wireless power transmitting apparatus comprising:
   a power amplifier;
   a coil connected to the power amplifier and configured to generate an electromagnetic field based on power received from the power amplifier;
   an impedance sensing circuit connected between the power amplifier and the coil;
   at least one auxiliary coil electromagnetically coupled to the coil; and
   a controller,
   wherein the controller is configured to:
   identify an impedance change from a signal sensed through the impedance sensing circuit; and
   adjust an operation configuration of the at least one auxiliary coil based on the identified impedance change.

2. The wireless power transmitting apparatus of claim 1, wherein the impedance sensing circuit comprises a directional coupler.

3. The wireless power transmitting apparatus of claim 2, wherein the impedance sensing circuit comprises:
   a waveform transducer configured to receive a forward signal detected through a first coupling port of the directional coupler and a backward signal detected through a second coupling port of the directional coupler to output a voltage waveform signal and a current waveform signal; and
   a phase detector configured to receive the voltage waveform signal and the current waveform signal output from the waveform transducer to detect a phase difference between a voltage signal and a current signal.

4. The wireless power transmitting apparatus of claim 3, wherein the waveform transducer is configured to:
   output the voltage waveform signal based on a difference of the forward signal and the backward signal; and
   output the current waveform signal based on a sum of the forward signal and the backward signal.

5. The wireless power transmitting apparatus of claim 3, wherein the controller is configured to identify the impedance change based on a phase difference detected by the phase detector.

6. The wireless power transmitting apparatus of claim 1, further comprising:
   a capacitor connected to the at least one auxiliary coil; and
   a switch connected to the capacitor,
   wherein the controller is configured to control turning on or off of the switch to control an operation of the at least one auxiliary coil.

7. The wireless power transmitting apparatus of claim 1, wherein the controller is configured to control an operation configuration of the at least one auxiliary coil to adjust a resonance frequency of an electromagnetic field generated through the coil.

8. The wireless power transmitting apparatus of claim 7, comprising multiple auxiliary coils,
   wherein the controller is configured to control turning on/off of multiple switches connected to each of the multiple auxiliary coils to adjust a resonance frequency of an electromagnetic field generated through the coil.

9. The wireless power transmitting apparatus of claim 3, further comprising:
   a first splitter configured to receive a forward signal detected through a first coupling port of the directional coupler and output a first forward signal and a second forward signal; and
   a second splitter configured to receive a backward signal detected through a second coupling port of the directional coupler and output a first backward signal and a second backward signal,
   wherein the waveform transducer is configured to receive the first forward signal output from the first splitter and the first backward signal output from the second splitter to output the voltage waveform signal and the current waveform signal.

10. The wireless power transmitting apparatus of claim 9, further comprising:
    a forward power detector configured to detect forward power from the second forward signal output from the first splitter; and a backward power detector configured to detect backward power from the second backward signal output from the second splitter, wherein the controller is configured to identify an impedance change based on the forward power and the backward power.

11. The wireless power transmitting apparatus of claim 3, further comprising:
a first attenuator configured to receive a forward signal detected through the first coupling port of the directional coupler to be attenuated; and
a second attenuator configured to receive a backward signal detected through the second coupling port of the directional coupler to be attenuated.

12. The wireless power transmitting apparatus of claim 1, comprising at least one capacitor connected to the coil,
wherein the coil and the at least one capacitor form a resonator.

13. The wireless power transmitting apparatus of claim 12, further comprising:
a first zero-crossing detector configured to output a result of detecting a zero-crossing from the voltage waveform signal output from the waveform transducer; and
a second zero-crossing detector configured to output a result of detecting a zero crossing from the current waveform signal output from the waveform transducer.

14. A method of wirelessly transmitting power by a wireless power transmitting apparatus, the method comprising:
generating an electromagnetic field through a coil based on power received from a power amplifier;
identifying an impedance change from a signal sensed through an impedance sensing circuit connected between the amplifier and the coil; and
adjusting an operation configuration of at least one auxiliary coil electromagnetically coupled with the coil based on the identified impedance change.

15. The method of claim 14, wherein the impedance sensing circuit comprises a directional coupler.

16. The method of claim 15, wherein the method comprising:
receiving a forward signal detected through a first coupling port of the directional coupler and a backward signal detected through a second coupling port of the directional coupler to output a voltage waveform signal and a current waveform signal through a waveform transducer; and
receiving the voltage waveform signal and the current waveform signal output from the waveform transducer to detect a phase difference between a voltage signal and a current signal through a phase detector.

17. The method of claim 15, wherein the method comprising:
outputting the voltage waveform signal based on a difference of the forward signal and the backward signal; and
outputting the current waveform signal based on a sum of the forward signal and the backward signal.

18. The method of claim 15, wherein the method comprising identifying the impedance change based on the phase difference detected by the phase detector.

19. The method of claim 14, wherein the method comprising controlling an operation configuration of the at least one auxiliary coil to adjust a resonance frequency of an electromagnetic field generated through the coil.

20. The method of claim 19, wherein the method comprising controlling turning on/off of multiple switches connected to each of multiple auxiliary coils to adjust a resonance frequency of an electromagnetic field generated through the coil.

\* \* \* \* \*